US009973219B2

(12) United States Patent
Lagler et al.

(10) Patent No.: US 9,973,219 B2
(45) Date of Patent: May 15, 2018

(54) PREDISTORTION SYSTEM AND METHOD

(71) Applicant: Rohde & Schwarz GmbH & Co. KG, Munich (DE)

(72) Inventors: Andreas Lagler, Rosenheim (DE); Bastian Bunsen, Graefelfing (DE); Martin Weiss, Holzkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days. days.

(21) Appl. No.: 15/423,207

(22) Filed: Feb. 2, 2017

(65) Prior Publication Data
US 2018/0102796 A1  Apr. 12, 2018

(30) Foreign Application Priority Data
Oct. 7, 2016 (EP) ..................................... 16192718

(51) Int. Cl.
*H04K 1/02* (2006.01)
*H04L 25/03* (2006.01)
*H04L 25/49* (2006.01)
*H04B 1/04* (2006.01)
*H03F 1/32* (2006.01)
*H03F 3/19* (2006.01)

(52) U.S. Cl.
CPC ............. *H04B 1/04* (2013.01); *H03F 1/3247* (2013.01); *H03F 3/19* (2013.01); *H03F 2201/3215* (2013.01); *H04B 2001/0425* (2013.01)

(58) Field of Classification Search
CPC ................. H03F 1/3247; H03F 1/3294; H03F 2201/3233; H03F 3/24; H03F 1/3241; H04L 27/368; H04L 25/03343; H03G 3/3042

USPC .................................................. 375/295–297
See application file for complete search history.

(56) References Cited

U.S. PATENT DOCUMENTS 5,053,728 A * 10/1991 Bogl ...................... H04L 27/122
                                                        332/100
5,214,671 A *  5/1993 Nakai ............... H04L 25/03038
                                                         333/18
(Continued)

FOREIGN PATENT DOCUMENTS

WO          9905784 A1     2/1999

OTHER PUBLICATIONS

European Search Report for related European Patent Application No. 16192718.1-1805 dated Apr. 4, 2017, 2 Pages.

*Primary Examiner* — James M Perez
(74) *Attorney, Agent, or Firm* — Ditthavong & Steiner, P.C.

(57) ABSTRACT

A predistortion system for optimizing the performance of a distorting component. The predistortion system comprises a signal generator, the distorting component, an analyzing device for frequency and/or time domain analysis, and a predistortion device. The signal generator generates a first signal according to a reference signal. Furthermore, the first signal after being passed through the distorting component results in a second signal. Then, the second signal after being passed through the analyzing device results in a third signal. Moreover, the third signal after being passed through the predistortion device results in a compensated signal. In addition to this, the reference signal is provided for the predistortion device.

11 Claims, 3 Drawing Sheets

(56) References Cited

U.S. PATENT DOCUMENTS

| | | | | |
|---|---|---|---|---|
| 6,239,657 B1* | 5/2001 | Bauer | H03F 1/3247 | 330/149 |
| 6,246,286 B1* | 6/2001 | Persson | H03F 1/3241 | 330/136 |
| 6,587,514 B1* | 7/2003 | Wright | H03F 1/3241 | 330/149 |
| 6,614,854 B1* | 9/2003 | Chow | H04L 1/0016 | 330/302 |
| 6,697,436 B1* | 2/2004 | Wright | G01N 27/4163 | 330/106 |
| 6,741,663 B1* | 5/2004 | Tapio | H03F 1/3247 | 375/297 |
| 6,756,845 B1* | 6/2004 | Mashhour | H03F 1/3258 | 330/149 |
| 6,798,843 B1* | 9/2004 | Wright | H03F 1/3241 | 330/149 |
| 6,836,517 B2* | 12/2004 | Nagatani | H03F 1/3247 | 375/296 |
| 6,907,085 B2* | 6/2005 | Kubo | H03F 1/3247 | 332/124 |
| 6,920,127 B2* | 7/2005 | Ozluturk | H03G 11/04 | 370/342 |
| 6,965,242 B2* | 11/2005 | Boss | G01R 29/26 | 324/614 |
| 6,973,401 B2* | 12/2005 | Eibl | G01R 27/32 | 702/106 |
| 7,058,369 B1* | 6/2006 | Wright | H01Q 1/243 | 375/297 |
| 7,158,581 B2* | 1/2007 | Weiss | H03F 1/32 | 375/296 |
| 7,333,557 B2* | 2/2008 | Rashev | H03F 1/3211 | 330/254 |
| 7,460,613 B2* | 12/2008 | Sahlman | H03F 1/3247 | 375/296 |
| 7,558,332 B2* | 7/2009 | Rashev | H03F 1/3211 | 330/278 |
| 7,583,754 B2* | 9/2009 | Liu | H03F 1/3247 | 375/278 |
| 7,720,175 B2* | 5/2010 | Yeon | H04L 27/2624 | 375/296 |
| 7,733,949 B2* | 6/2010 | Jin | H04B 17/354 | 375/221 |
| 7,787,563 B2* | 8/2010 | Tal | H03M 7/3017 | 375/297 |
| 7,944,295 B2* | 5/2011 | Hongo | H03F 1/3247 | 330/149 |
| 7,957,707 B2* | 6/2011 | Staudinger | H03F 1/3247 | 375/297 |
| 8,040,182 B2* | 10/2011 | Horiguchi | H03F 1/30 | 330/149 |
| 8,094,054 B2* | 1/2012 | Helfenstein | H04L 25/49 | 341/144 |
| 8,194,788 B2* | 6/2012 | Ye | H03G 3/001 | 375/316 |
| 8,238,849 B2* | 8/2012 | Pratt | H03F 1/3247 | 330/149 |
| 8,340,214 B2* | 12/2012 | Kang | H04L 25/03343 | 375/232 |
| 8,446,979 B1* | 5/2013 | Yee | H04L 27/368 | 375/219 |
| 8,498,591 B1* | 7/2013 | Qian | H04B 1/0475 | 375/297 |
| 8,665,938 B2* | 3/2014 | Yu | H04W 24/10 | 375/220 |
| 8,711,974 B2* | 4/2014 | Kumar | H03F 1/3294 | 375/232 |
| 8,724,734 B2* | 5/2014 | Sasaki | G10L 19/00 | 375/295 |
| 8,804,871 B2* | 8/2014 | Rimini | H04B 1/525 | 330/149 |
| 8,831,136 B2* | 9/2014 | Ishikawa | H04B 15/00 | 375/295 |
| 8,842,033 B1* | 9/2014 | Abramzon | H03M 1/0626 | 341/144 |
| 8,971,829 B2* | 3/2015 | Muhammad | H03F 1/3247 | 375/296 |
| 9,042,487 B2* | 5/2015 | Raghu | H04L 27/3863 | 330/291 |
| 9,190,974 B2* | 11/2015 | Richt | H03G 3/3042 | |
| 9,203,448 B2* | 12/2015 | Morita | H04B 1/0475 | |
| 2002/0080891 A1* | 6/2002 | Ahn | H03F 1/3247 | 375/297 |
| 2002/0186783 A1* | 12/2002 | Opas | H03F 1/3247 | 375/297 |
| 2002/0191710 A1* | 12/2002 | Jeckeln | H03F 1/3247 | 375/296 |
| 2002/0191711 A1* | 12/2002 | Weiss | H03F 1/32 | 375/296 |
| 2004/0121741 A1* | 6/2004 | Rashev | H03F 1/3211 | 455/114.3 |
| 2004/0165678 A1* | 8/2004 | Nadiri | H04L 1/244 | 375/296 |
| 2004/0247042 A1* | 12/2004 | Sahlman | H03F 1/3247 | 375/297 |
| 2004/0257060 A1* | 12/2004 | Eibl | G01R 27/32 | 324/76.77 |
| 2005/0163249 A1* | 7/2005 | McCallister | H03H 21/0012 | 375/296 |
| 2005/0255814 A1* | 11/2005 | Song | H03F 1/30 | 455/114.3 |
| 2006/0056536 A1* | 3/2006 | Hori | H03F 1/3282 | 375/296 |
| 2006/0188038 A1* | 8/2006 | Shako | H03F 1/3247 | 375/296 |
| 2006/0240786 A1* | 10/2006 | Liu | H03F 1/3247 | 455/114.3 |
| 2007/0237260 A1* | 10/2007 | Hori | H03F 1/3247 | 375/296 |
| 2008/0171518 A1* | 7/2008 | Lorenzen | H04B 17/13 | 455/67.14 |
| 2008/0268789 A1* | 10/2008 | Plaumann | H03F 1/02 | 455/67.14 |
| 2011/0044405 A1* | 2/2011 | Sasaki | G10L 19/00 | 375/296 |
| 2013/0064319 A1* | 3/2013 | Richt | H03G 3/3042 | 375/268 |
| 2013/0329832 A1* | 12/2013 | Morita | H04B 1/0475 | 375/296 |
| 2013/0336422 A1* | 12/2013 | Sombrin | H03F 1/3247 | 375/297 |
| 2015/0023451 A1* | 1/2015 | Muhammad | H04B 1/0475 | 375/297 |
| 2016/0043830 A1* | 2/2016 | Simon | H04L 5/0007 | 375/295 |
| 2016/0173147 A1* | 6/2016 | Ishikawa | H04B 1/0475 | 375/296 |

* cited by examiner

PREDISTORTION SYSTEM AND METHOD

PRIORITY

This application claims priority of the European patent application EP 16 192 718.1 filed on Oct. 7, 2016, which is incorporated by reference herewith.

FIELD OF THE INVENTION

The invention relates to a predistortion system and a predistortion method for optimizing the performance of distorting components.

BACKGROUND OF THE INVENTION

Typically, with special respect to communication applications, a linear behavior of the employed components, especially of amplifiers, is not only desired but even necessary in order to ensure the avoidance of nonlinear distortion, and thus the prevention of an undesirable interference spectrum. In this context, due to the fact that in practice, there are no ideal components having a completely linear characteristic available, the performance of distorting components has to be optimized especially regarding linearity.

WO 99/05784 A1 discloses a correcting device for automatically correcting a high frequency power amplifier with the aid of predistortion. The correcting device has a mechanism for generating a reference carrier from a measured input signal of the high frequency power amplifier, and a synchronous demodulator for generating an input envelope curve from a reference signal.

Nevertheless, the aforementioned document does not consider providing the reference signal not only for the purpose of generating a desired signal but also for the purpose of predistortion. As a consequence of the lack of providing the reference signal also for predistortion, the total noise is the sum of the noise floor of the system and the respective noise components of each of the elements involved in predistortion, which leads to a non-optimal, respectively faulty, predistortion, and thus to a not best optimized performance of the amplifier with special respect to linearity.

Accordingly, there is a need to provide a predistortion system and a predistortion method for optimizing the performance of distorting components with special respect to linearity, wherein the reference signal for generating a desired output signal is not only provided for this purpose but also for predistortion.

SUMMARY OF THE INVENTION

According to a first aspect of the invention, a predistortion system for optimizing the performance of a distorting component is provided. The predistortion system comprises a signal generator, the distorting component, an analyzing device for frequency and/or time domain analysis, and a predistortion device. The signal generator generates a first signal according to a reference signal, wherein the first signal after being passed through the distorting component results in a second signal, wherein the second signal after being passed through the analyzing device results in a third signal, and wherein the third signal after being passed through the predistortion device results in a compensated signal. In addition to this, the reference signal is provided for the predistortion device. Advantageously, the optimization of the performance of the distorting component is solely restricted by the noise floor of the predistortion system.

According to a first preferred implementation form of the first aspect, the compensated signal, which correlates with the reference signal, is fed back to the signal generator.

According to a further preferred implementation form of the first aspect, the analyzing device is a spectrum analyzer or an oscilloscope or a combination of a down converter and a digitizer.

According to a further preferred implementation form of the first aspect, the distorting component is an amplifier.

According to a further preferred implementation form of the first aspect, at least one of the reference signal, the first signal, the second signal, the third signal, and the compensated signal is a quadrature signal.

According to a further preferred implementation form of the first aspect, at each iteration step, the compensated signal is modified on the basis of the deviation of the third signal from the reference signal.

According to a further preferred implementation form of the first aspect, at each iteration step, the predistortion device modifies the compensated signal in a manner that each sample of the compensated signal is replaced by the product of the respective sample of the previous compensated signal, and the quotient of the corresponding sample of the reference signal and the respective sample of the third signal.

According to a further preferred implementation form of the first aspect, for initializing the iteration, the compensated signal is set to the reference signal, and for terminating the iteration, a maximum number of iterations is predefined.

According to a second aspect of the invention, a predistortion method for optimizing the performance of a distorting component with the aid of a predistortion system comprising a signal generator, the distorting component, an analyzing device for frequency and/or time domain analysis, and a predistortion device is provided. The predistortion method comprises the steps of generating a first signal according to a reference signal with the aid of the signal generator, wherein the first signal after being passed through the distorting component results in a second signal, wherein the second signal after being passed through the analyzing device results in a third signal, wherein the third signal after being passed through the predistortion device results in a compensated signal, and providing the reference signal for the predistortion device.

According to a first preferred implementation form of the second aspect, the compensated signal, which correlates with the reference signal in an iterative manner, is fed back to the signal generator.

According to a further preferred implementation of the second aspect, the analyzing device is a spectrum analyzer or an oscilloscope or a combination of a down converter and digitizer and/or the distorting component is an amplifier.

According to a further preferred implementation of the second aspect, at least one of the reference signal, the first signal, the second signal, the third signal, and the compensated signal is a quadrature signal.

According to a further preferred implementation of the second aspect, at each iteration step, the compensated signal is modified on the basis of the deviation of the third signal from the reference signal.

According to a further preferred implementation of the second aspect, at each iteration step, the predistortion device modifies the compensated signal in a manner that each sample of the compensated signal is replaced by the product of the respective sample of the previous compensated signal, and the quotient of the corresponding sample of the reference signal and the respective sample of the third signal.

According to a further preferred implementation of the second aspect, for initializing the iteration, the compensated signal is set to the reference signal, and for terminating the iteration, a maximum number of iterations is predefined.

BRIEF DESCRIPTION OF THE DRAWINGS

Exemplary embodiments of the invention are now further explained with respect to the drawings by way of example only, and not for limitation. In the drawings.

Before exemplary embodiments of the invention are explained with respect to the drawings by way of example, some general aspects of the invention are explained in the following.

Generally, for predistortion, especially digital predistortion, a model-based characterization of the respective distorting component can be used, which is disadvantageously always the same for every wave form. As a consequence of this, digital predistortion based on model-based characterization of the distorting component does not achieve transmission quality as high as possible.

In accordance with the present invention, due to the iterative predistortion, respectively iterative digital predistortion, a best optimization of the performance of a distorting component is achieved for any desired wave form such as Long Term Evolution (LTE), Global System for Mobile communication (GSM), radar signals, etc.

Said performance optimization with the aid of the present invention may exemplarily relate to maximum linearization, maximization of Root Mean Square (RMS), minimization of the Adjacent Channel Power (ACP), respectively ACP leakage rate, or minimization of the Error Vector Magnitude (EVM) with respect to a reference signal.

In addition to this, it is to be pointed out that according to the present invention, the optimization of the performance of the distorting component is solely restricted by the noise floor of the predistortion system.

DETAILED DESCRIPTION OF PREFERRED EMBODIMENTS

Figure 1:
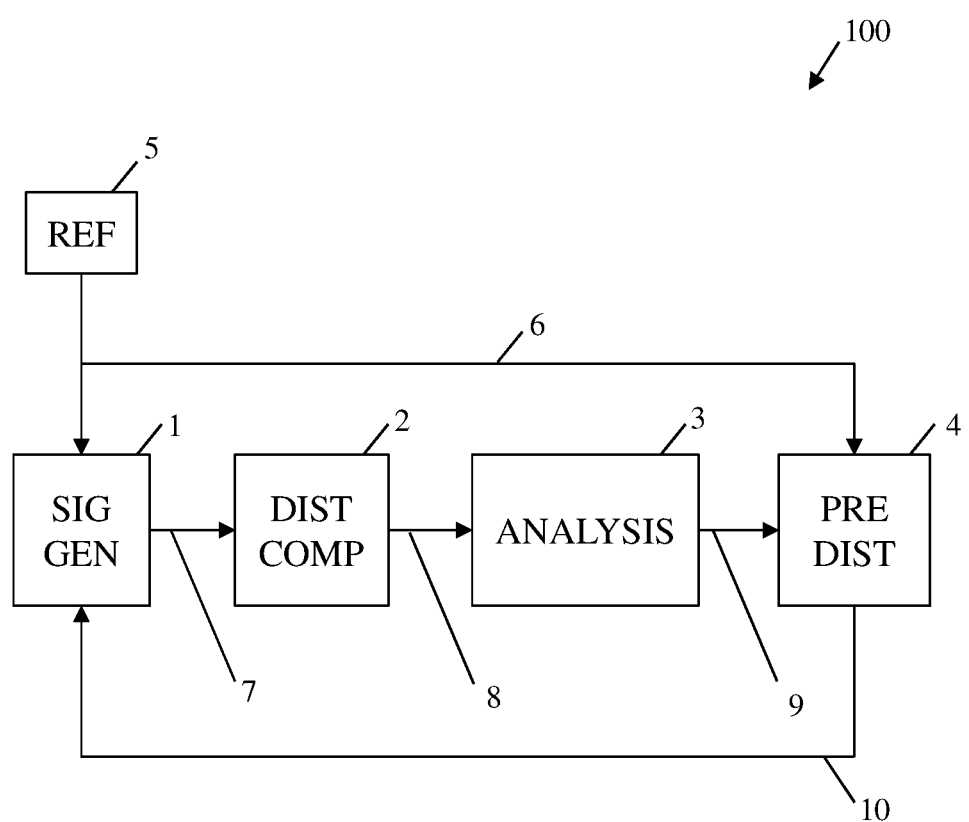
FIG. 1 shows a block diagram of an exemplary embodiment of the inventive system.

Now, from FIG. 1, an exemplary embodiment of the inventive system 100 can be seen. A signal generator 1 generates a first signal 7 according to a reference signal 6 which is provided by reference signal source 5.

In the exemplary case according to FIG. 1, the reference signal source 5 is an external reference signal source. Alternatively, the reference signal source 5 may advantageously be part of the signal generator 1. Further advantageously, the reference signal source 5 may be implemented in hardware or software or a combination thereof. In addition to this, the reference signal 6 may be a fixed signal or a user-defined signal of any desired wave form.

Then, the first signal 7 is passed to a distorting component 2 which distorts the first signal 7 and outputs a corresponding second signal 8. Advantageously, the distorting component 2 is an amplifier.

Furthermore, an analyzing device 3 for frequency and/or time domain analysis, preferably a spectrum analyzer or an oscilloscope or at least a combination of a downconverter and a digitizer, analyses the second signal 8 and passes a respective third signal 9 to a predistortion device 4.

For the predistortion device 4, not only the third signal 9 is provided but also the reference signal 6. On the basis of these signals 6 and 9, the predistortion device 4 generates a compensated signal 10 which is fed back to the signal generator 1.

In addition to this, the compensated signal 10 correlates with the reference signal 6 in an iterative manner. More precisely, the compensated signal is modified on the basis of the deviation of the third signal 9 from the reference signal 6. Furthermore, at each iteration step, the predistortion device 4 modifies the compensated signal 10 in a manner that each sample of the compensated signal 10 is replaced by the product of the respective sample of the previous compensated signal, in other words, the compensated signal 10 of the previous iteration step, and the quotient of the corresponding sample of the reference signal 6 and the respective sample of the third signal 9.

Moreover, for initializing the iteration, the compensated signal 10 is set to the reference signal 6. Alternatively, the previous compensated signal, in other words, the compensated signal 10 of the previous iteration step, is set to the reference signal 6. On the other hand, for terminating the iteration, a maximum number of iterations is predefined, which advantageously leads to convergence. Alternatively, the value of the respective error vector magnitude can be used for terminating the iteration. In this case, the iteration will terminate if the value of the error vector magnitude is less than a corresponding threshold value.

Furthermore, it should be mentioned that at least one of the above-mentioned signals, namely the reference signal 6, the first signal 7, the second signal 8, the third signal 9, and the compensated signal 10 is a quadrature signal.

Figure 2:
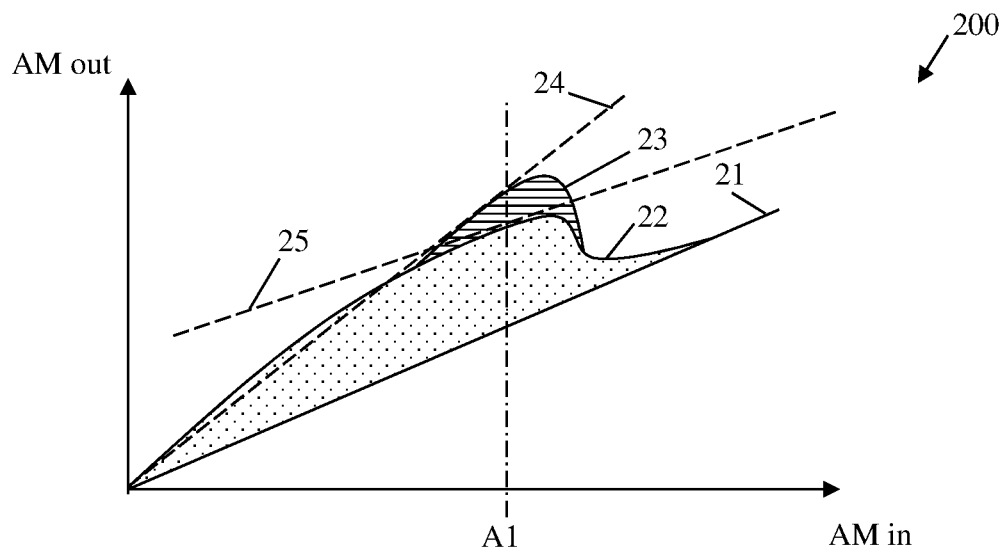
FIG. 2 shows an exemplary input-output diagram of an amplifier with respect to amplitude.

Now, with respect to FIG. 2 an exemplary input-output diagram 200 of an amplifier regarding amplitude is shown. In this exemplary case, straight line 21 illustrates linear operation of the amplifier, for instance, class-A operation.

Furthermore, whereas curve 22 illustrates nonlinear operation of the amplifier, for example, class-AB operation, without predistortion, curve 23 exemplifies the same use case but with predistortion.

From FIG. 2 with special respect to curves 22 and 23, it becomes immediately clear that predistortion, especially iterative digital predistortion, advantageously leads to a large linear range of the amplifier.

In addition to this, it should be mentioned that for a predefined input amplitude value A1, the slope illustrated with the aid of straight line 24 in the respective point of curve 23 with predistortion is advantageously higher than the slope visualized by straight line 25 in the corresponding point of curve 22 without predistortion.

Figure 3:
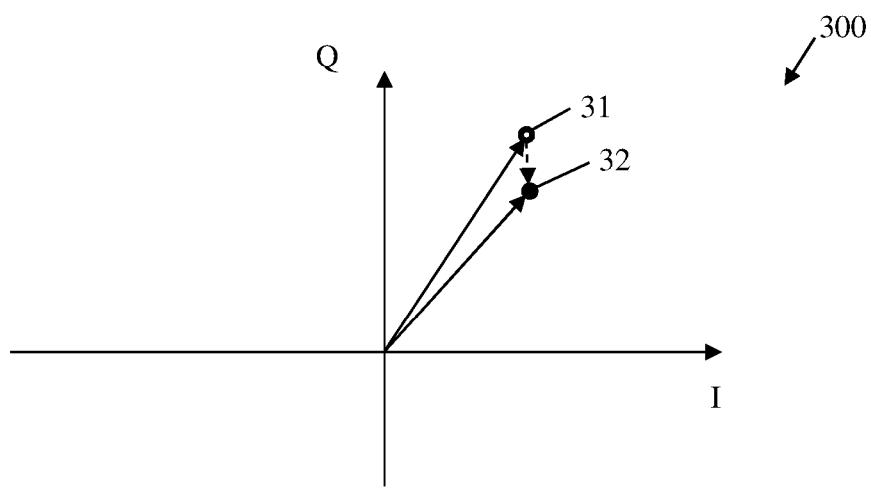
FIG. 3 shows an exemplary I-Q constellation diagram with respect to a symbol being relocated with the aid of predistortion.

Moreover, with respect to FIG. 3, due to predistortion, especially due to iterative digital predistortion, constellation point 31 of I-Q constellation diagram 300 is relocated in order to be placed at the ideal point 32 which corresponds to the desired symbol. For the purpose of relocating according to the example of FIG. 3, amplitude and phase are adjusted accordingly. Alternatively, solely amplitude or phase may be changed.

In this context, it is to be pointed out that it is particularly advantageous that predistortion is done iteratively because in this manner, the memory of the device under test, respectively of the distorting component or the amplifier, wherein said memory is attributable to certain characteristics of the device under test such as group delay, cannot cause errors due to a complete elimination of the latter.

Figure 4:
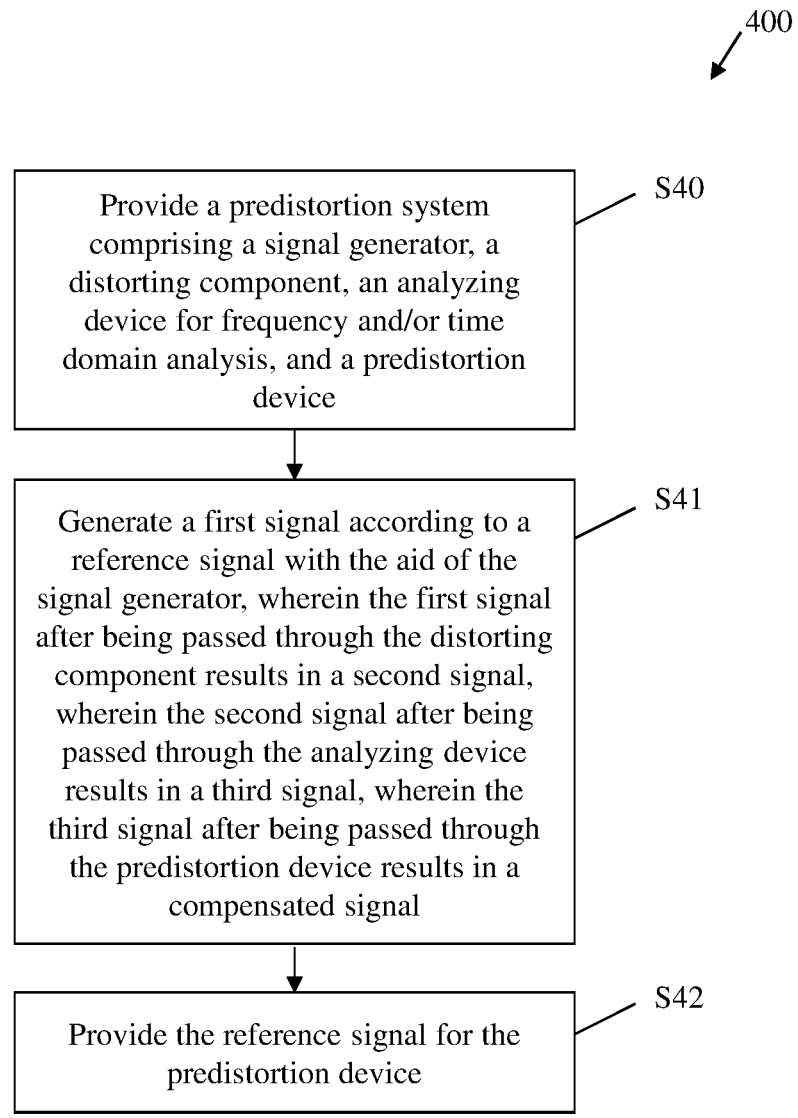
FIG. 4 shows a flow chart of an embodiment of the second aspect of the invention.

Finally, FIG. 4 shows a flow chart 400 of an embodiment of the inventive method. In a first step S40, a predistortion system comprising a signal generator, a distorting component, an analyzing device for frequency and/or time domain analysis, and a predistortion device is provided. In a second step S41, a first signal according to a reference signal is generated with the aid of the signal generator, wherein the first signal after being passed through the distorting component results in a second signal, wherein the second signal after being passed through the analyzing device results in a third signal, wherein the third signal after being passed through the predistortion device results in a compensated signal. Then, in a third step S42, the reference signal is provided for the predistortion device.

While various embodiments of the present invention have been described above, it should be understood that they have been presented by way of example only, and not limitation. Numerous changes to the disclosed embodiments can be made in accordance with the disclosure herein without departing from the spirit or scope of the invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. A predistortion system for optimizing the performance of a distorting component, the predistortion system comprising:
    a signal generator,
    the distorting component,
    an analyzing device for frequency and/or time domain analysis, and
    a predistortion device,
    wherein the signal generator generates a first signal according to a reference signal,
    wherein the first signal after being passed through the distorting component results in a second signal,
    wherein the second signal after being passed through the analyzing device results in a third signal,
    wherein the third signal after being passed through the predistortion device results in a compensated signal,
    wherein the reference signal is provided for the predistortion device,
    wherein the compensated signal, which correlates with the reference signal in an iterative manner, is fed back to the signal generator, and
    wherein at each iteration step, the predistortion device modifies the compensated signal in a manner that each sample of the compensated signal is replaced by the product of the respective sample of the previous compensated signal, and the quotient of the corresponding sample of the reference signal and the respective sample of the third signal.

2. The predistortion system according to claim 1, wherein the analyzing device is a spectrum analyzer or an oscilloscope or a combination of a down converter and a digitizer.

3. The predistortion system according to claim 1, wherein the distorting component is an amplifier.

4. The predistortion system according to claim 1, wherein at least one of the reference signal, the first signal, the second signal, the third signal, and the compensated signal is a quadrature signal.

5. The predistortion system according to claim 1, wherein at each iteration step, the compensated signal is modified on the basis of the deviation of the third signal from the reference signal.

6. The predistortion system according to claim 1, wherein for initializing the iteration, the compensated signal is set to the reference signal, and
    wherein for terminating the iteration, a maximum number of iterations is predefined.

7. A predistortion method for optimizing the performance of a distorting component with the aid of a predistortion system comprising a signal generator, the distorting component, an analyzing device for frequency and/or time domain analysis, and a predistortion device, the method comprising the steps of:
    generating a first signal according to a reference signal with the aid of the signal generator, wherein the first signal after being passed through the distorting component results in a second signal, wherein the second signal after being passed through the analyzing device results in a third signal, wherein the third signal after being passed through the predistortion device results in a compensated signal, and
    providing the reference signal for the predistortion device,
    wherein the compensated signal, which correlates with the reference signal in an iterative manner, is fed back to the signal generator, and
    wherein at each iteration step, the predistortion device modifies the compensated signal in a manner that each sample of the compensated signal is replaced by the product of the respective sample of the previous compensated signal, and the quotient of the corresponding sample of the reference signal and the respective sample of the third signal.

8. The predistortion method according to claim 7, wherein the analyzing device is a spectrum analyzer or an oscilloscope or a combination of a down converter and digitizer and/or the distorting component is an amplifier.

9. The predistortion method according to claim 7, wherein at least one of the reference signal, the first signal, the second signal, the third signal, and the compensated signal is a quadrature signal.

10. The predistortion method according to claim 7, wherein at each iteration step, the compensated signal is modified on the basis of the deviation of the third signal from the reference signal.

11. The predistortion method according to claim 7, wherein for initializing the iteration, the compensated signal is set to the reference signal, and
    wherein for terminating the iteration, a maximum number of iterations is predefined.

* * * * *